(12) United States Patent
Zhang et al.

(10) Patent No.: US 11,374,192 B2
(45) Date of Patent: Jun. 28, 2022

(54) FLEXIBLE TRANSPARENT ELECTRODE, FLEXIBLE DISPLAY PANEL, MANUFACTURE METHOD, AND DISPLAY DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Zhao Zhang, Beijing (CN); Xiaofeng Zhang, Beijing (CN); Ruichao Liu, Beijing (CN); Kai Chen, Beijing (CN); Yanyun Li, Beijing (CN); Zeliang Li, Beijing (CN); Xuelu Wang, Beijing (CN)

(73) Assignees: ORDOS YUANSHENG OPTOELECTRONICS CO., LTD., Ordos (CN); BOE TECHNOLOGY GROUP CO., LTD., Beijing (CN)

( * ) Notice: Subject to any disclaimer, the term of this patent is extended or adjusted under 35 U.S.C. 154(b) by 9 days.

(21) Appl. No.: 17/042,487

(22) PCT Filed: Apr. 14, 2020

(86) PCT No.: PCT/CN2020/084613
§ 371 (c)(1),
(2) Date: Sep. 28, 2020

(87) PCT Pub. No.: WO2020/216097
PCT Pub. Date: Oct. 29, 2020

(65) Prior Publication Data
US 2021/0159443 A1  May 27, 2021

(30) Foreign Application Priority Data

Apr. 26, 2019 (CN) .......................... 201910344220.9

(51) Int. Cl.
*H01L 51/52* (2006.01)
*H01L 27/32* (2006.01)
*H01L 51/56* (2006.01)

(52) U.S. Cl.
CPC ........ *H01L 51/5215* (2013.01); *H01L 27/326* (2013.01); *H01L 51/5212* (2013.01);
(Continued)

(58) Field of Classification Search
CPC .................................................. H01L 51/5215
See application file for complete search history.

(56) References Cited

U.S. PATENT DOCUMENTS

| 10,002,927 B2 | 6/2018 | Woo et al. |
| 2012/0112346 A1 | 5/2012 | Ning |

(Continued)

FOREIGN PATENT DOCUMENTS

| CN | 104934108 A | 9/2015 |
| CN | 104934109 A | 9/2015 |

(Continued)

*Primary Examiner* — Douglas M Menz
(74) *Attorney, Agent, or Firm* — Chiwin Law LLC

(57) ABSTRACT

The present disclosure provides a flexible transparent electrode, a flexible display panel, related manufacture methods, and a display device. The flexible transparent electrode includes a graphene body and metal nanowires. At least part of the metal nanowires is inserted into the graphene body to form an interpenetrating body structure.

16 Claims, 8 Drawing Sheets

(52) U.S. Cl.
CPC ........ *H01L 51/56* (2013.01); *H01L 2227/323* (2013.01); *H01L 2251/5338* (2013.01)

(56) References Cited

U.S. PATENT DOCUMENTS

| | | |
|---|---|---|
| 2013/0200421 A1 | 8/2013 | Jeong |
| 2014/0231718 A1 | 8/2014 | Lin |
| 2017/0133469 A1* | 5/2017 | Woo ...................... H01L 29/167 |

FOREIGN PATENT DOCUMENTS

| | | |
|---|---|---|
| CN | 107025953 A | 8/2017 |
| CN | 110085763 A | 8/2019 |

\* cited by examiner

FLEXIBLE TRANSPARENT ELECTRODE, FLEXIBLE DISPLAY PANEL, MANUFACTURE METHOD, AND DISPLAY DEVICE

This application is a U.S. National Phase Entry of International Application No. PCT/CN2020/084613 filed on Apr. 14, 2020, designating the United States of America and claiming priority to Chinese Patent Application No. 201910344220.9, filed on Apr. 26, 2019. The present application claims priority to and the benefit of the above-identified applications and the above-identified applications are incorporated by reference herein in their entirety.

TECHNICAL FIELD

The embodiments of the present disclosure relate to a flexible transparent electrode, a flexible display panel, related manufacture methods, and a display device.

BACKGROUND

A transparent conductive film is an important part of many optoelectronic devices, such as flat panel displays, organic light-emitting diodes, smart windows, and other devices. Tin-doped indium oxide such as indium tin oxide (ITO) has high conductivity and high light transmittance, and therefore, has become the main material for the transparent conductive films.

SUMMARY

Embodiments of the present disclosure disclose a flexible transparent electrode, a flexible display panel, related manufacture methods, and a display device.

At least one embodiment of the present disclosure provides a flexible transparent electrode, including: a graphene body and metal nanowires. At least part of the metal nanowires is inserted into the graphene body to form an interpenetrating body structure.

For example, in an embodiment of the present disclosure, the graphene body has at least one hole-shaped defect structure, and the at least part of the metal nanowires is inserted into the hole-shaped defect structure.

For example, in an embodiment of the present disclosure, a part of the metal nanowires located outside the hole-shaped defect structure is arranged crosswise to form a mesh structure.

For example, in an embodiment of the present disclosure, the metal nanowires include a copper nanowire or a silver nanowire.

For example, in an embodiment of the present disclosure, a hole diameter of the at least one hole-shaped defect structure ranges from 1 micron to 10 microns.

Another embodiment of the present disclosure provides a manufacture method of the flexible transparent electrode as mentioned above, including: preparing graphene; providing precursors for forming the metal nanowires, providing an alkaline solution and a reducing agent solution; and mixing the graphene, the precursors, the alkaline solution, and the reducing agent solution to form the interpenetrating body structure.

For example, in an embodiment of the present disclosure, providing the precursors for forming the metal nanowires includes: preparing a mixed solution of respective precursors of the metal nanowires; mixing the graphene, the precursors, the alkaline solution, and the reducing agent solution includes: mixing the graphene, the mixed solution, the alkaline solution, and the reducing agent solution to make them react for a certain period of time to obtain a product of the interpenetrating body structure composed of the metal nanowires and the graphene body; after forming the interpenetrating body structure, the manufacture method further includes: washing and drying the product to form the flexible transparent electrode.

For example, in an embodiment of the present disclosure, mixing the graphene, the precursors, the alkaline solution, and the reducing agent solution includes: adding the precursors to the graphene to react for a certain period of time, and then adding the alkaline solution and the reducing agent solution in sequence.

For example, in an embodiment of the present disclosure, after preparing the graphene and before mixing the graphene with the precursors, the manufacture method further includes: performing heat-treating on the graphene prepared to make an oxygen-containing group on a surface of the graphene disappear, thereby forming a hole-shaped defect structure at a position where the oxygen-containing group disappears.

For example, in an embodiment of the present disclosure, oxygen element in the graphene is reduced by 90%-95% during a process of performing the heat-treating.

For example, in an embodiment of the present disclosure, performing the heat-treating on the graphene prepared includes: performing the heat-treating on the graphene in an argon atmosphere at a temperature ranging from 550° C. to 650° C.

Another embodiment of the present disclosure provides a flexible display panel, including a plurality of anodes. Each anode is the flexible transparent electrode in any one of the above mentioned embodiments.

Another embodiment of the present disclosure provides a flexible display panel, including: a base substrate; and a plurality of pixel units located on the base substrate. Each pixel unit includes a driving circuit located on the base substrate and a light-emitting element located on a side of the driving circuit away from the base substrate, each light-emitting element includes a first electrode, a light-emitting layer, and a second electrode that are stacked, and the second electrode is located on a side of the light-emitting layer facing the driving circuit and is electrically connected to the driving circuit. The second electrode is the flexible transparent electrode in any one of the above mentioned embodiments.

Another embodiment of the present disclosure provides a display device, including the flexible display panel as mentioned above.

Another embodiment of the present disclosure provides a manufacture method of the flexible display panel, including: forming a driving circuit on a base substrate; forming a plurality of anodes, which are independently arranged, on the driving circuit. Each anode is the flexible transparent electrode in any one of the above mentioned embodiments.

For example, in an embodiment of the present disclosure, before forming the plurality of anodes, the manufacture method further includes: forming a pixel defining layer on a side of the driving circuit away from the base substrate.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects.

In the research, the inventor of the present application found that the indium tin oxide material that is used as a transparent electrode of an organic light-emitting diode device has some disadvantages, such as the continuous increase in the price of the raw material indium, and the expensive cost for manufacturing the indium tin oxide. In addition, the indium tin oxide material is prone to break or fall off during the bending process, resulting in a significant decrease in the conductivity of indium tin oxide.

Figure 1:
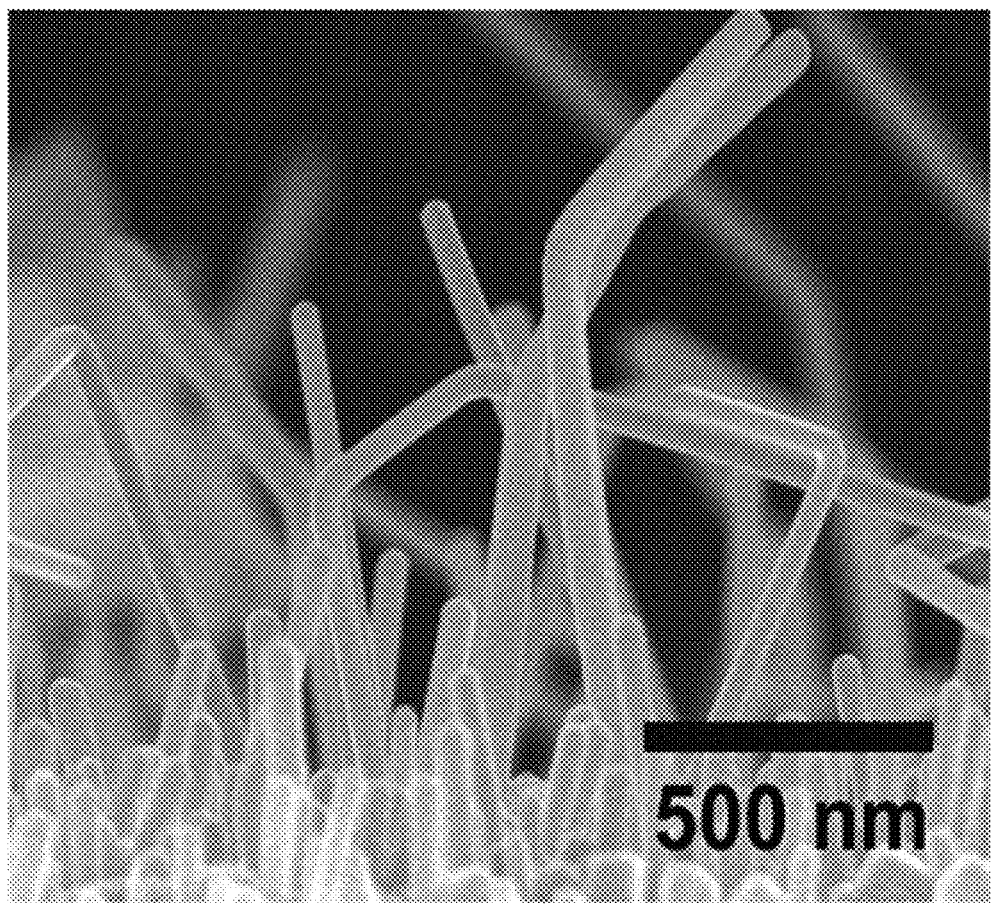
FIG. 1 is a schematic diagram of a morphology of metal nanowires.

At present, new materials represented by conductive polymers, metal nanomaterials, carbon nanotubes, and graphene show good development potential. Metal nanowires are one-dimensional nanostructures with a length-to-diameter ratio (the ratio of the length to the diameter of the metal nanowire) greater than 1000, and the morphology of the metal nanowires is shown in FIG. 1. A thin film formed by overlapping the nanowires has excellent electrical conductivity and transmittance. Silver nanowires and copper nanowires have certain advantages in terms of electrical conductivity. The square resistance of the transparent conductive electrode prepared with the silver nanowires can be as low as 30Ω/□, and meanwhile, the transmittance of the transparent conductive electrode can reach 90%. However, because the silver is a precious metal, the large-scale application of silver is restricted. In recent years, as people's research on copper nanowires has become more and more in-depth, people have been found that the advantages of copper nanowires include that: the intrinsic conductivity of copper is very high, and is only about 6% lower than that of silver; the price of copper is nearly 100 times cheaper than that of silver and indium tin oxide, and the reserves of copper are almost 1000 times that of silver and indium tin oxide; the prepared copper nanowire transparent conductive film is similar to indium tin oxide in terms of conductivity and light transmittance. However, copper nanowires are easily oxidized during the processes of preparing and post-storage and processing, the film resistance of the copper nanowire will increase with the increase of exposure time in the air, and accordingly, the conductivity of copper nanowires will decrease with the increase of exposure time in the air. In addition, the mesh structure formed by the copper nanowires has a weak bonding force with a flexible substrate, such as a transparent insulation layer and the like, which easily affects the device stability.

Graphene has extremely high light transmittance and electrical conductivity, and has broad prospects in the field of flexible transparent electrodes. The highest transmittance of single-layer graphene can reach 97.7%, which has exceeded the transmittance of most conductive materials, and the graphene has high stability. However, the unmodified graphene prepared by a traditional method has a high square resistance due to the presence of many oxygen-containing groups on the edges; at the same time, the work function of graphene is relatively low, and is only 4.4 eV, which is not conducive to hole injection and also limits the development and application of graphene in flexible transparent electrodes.

The flexible transparent electrode and the manufacture method thereof, the flexible display panel and the manufacture method thereof, and the display device provided by the embodiments of the present disclosure will be described below with reference to the accompanying drawings.

Figure 2:
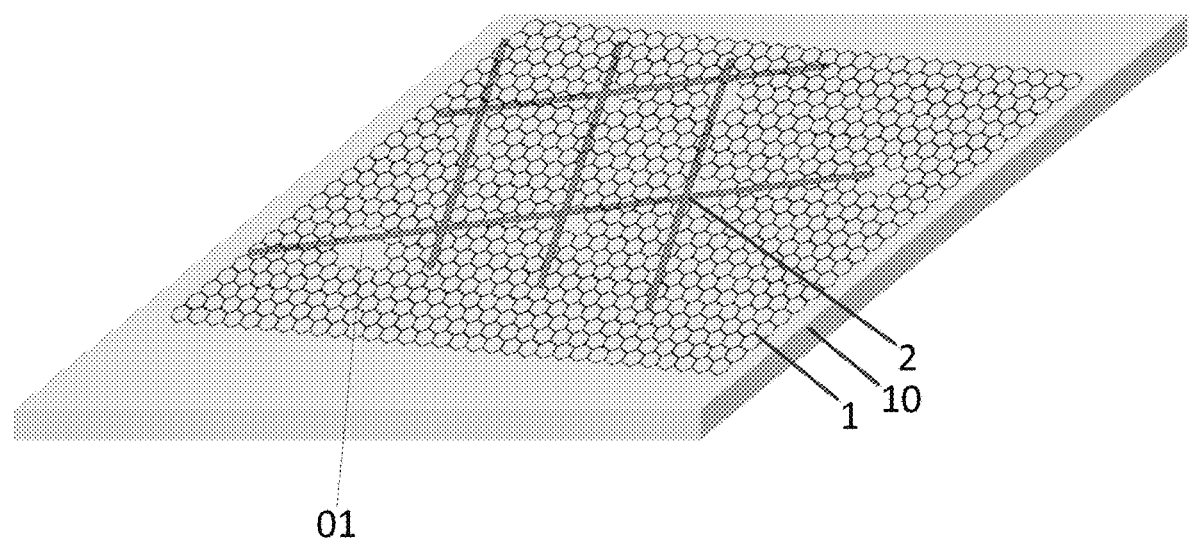
FIG. 2 is a schematic diagram of a structure of a flexible transparent electrode provided by an embodiment of the present disclosure.

FIG. 2 is a flexible transparent electrode according to an embodiment of the present disclosure. As shown in FIG. 2, the flexible transparent electrode includes a graphene body 1 and metal nanowires 2, and at least part of the metal nanowires 2 is inserted into the graphene body 1 to form an interpenetrating body structure. For example, the graphene body 1 and the metal nanowires 2 may be located on a flexible substrate 10.

The above-mentioned flexible transparent electrode provided by the embodiments of the present disclosure includes a graphene body and metal nanowires, and the metal nanowires and the graphene body constitute an interpenetrating body structure. The flexible transparent electrode with the interpenetrating body structure provided by the present disclosure, on the one hand, can solve the problems of poor stability, easy oxidation, large roughness, and poor bonding force with the flexible substrate of the metal nanowires; and on the other hand, can also solve the problems of high square resistance and low work function, which is not conducive to hole injection, of the graphene. Therefore, the interpenetrating body structure formed by combining the metal nanowires and the graphene body can make the metal nanowires and the graphene body compensate each other for their respective defects, so as to form a flexible transparent electrode for replacing the ITO material; in addition, the interpenetrating body structure has high conductivity and transmittance, strong bonding force with the flexible substrate, and high stability, which can increase the life of the device when applied to the device.

For example, in the above-mentioned flexible transparent electrode provided by the embodiment of the present disclosure, as shown in FIG. 2, the graphene body 1 has at least one hole-shaped defect structure 01, and the at least part of the metal nanowires 2 is inserted into the hole-shaped defect structure 01. The embodiments of the present disclosure take a case where the number of metal nanowires 2 is multiple, and the graphene body 1 has a plurality of hole-shaped defect structures 01 as an example, in a case where the number of hole-shaped defect structures 01 is less than the number of metal nanowires 2, a part of the metal nanowires 2 can be inserted into the hole-shaped defect structures, and the other part of the metal nanowires 2 is not inserted into the hole-shaped defect structures. For example, the hole diameter of each hole-shaped defect structure 01 may be in a range of 1~10 microns, and at least one metal nanowire can be inserted into each hole-shaped defect structure 01.

For example, the graphene can be produced by reduction of graphene oxide, however, under the influence of oxidation-reduction reaction, some oxygen-containing groups will remain in the graphene that is formed, that is, the surface of unmodified graphene has many oxygen-containing groups, and the presence of oxygen-containing groups has a certain effect on the conductivity of the graphene. In the embodiments of the present disclosure, the heat-treating is performed on the obtained graphene, such as performing the heat-treating on the obtained graphene in an argon atmosphere at a temperature ranging from 550° C. to 650° C. (for example, 600° C.), so that oxygen-containing groups can be combined with carbon atoms of the graphene to form a gas to release, and therefore, the above-mentioned hole-shaped defect structures are formed at the positions where the oxygen-containing groups are located. For example, during the heat-treating process, the oxygen element in the graphene is reduced by 90%-95%, and as a result, most of the oxygen-containing groups will disappear, so as to leave the hole-shaped defect structures.

Due to the high activity and the low chemical barrier of the remaining groups at the positions of the defect structures, in a case where the precursors for forming the metal nanowires and the graphene with defect structures are mixed under a certain condition, the metal nanowires are extremely easy to grow at the defect structures. Because the surface of the graphene has many defect structures, the metal nanowires grow at the plurality of defect structures to form an interpenetrating body structure in which the metal nanowires 2 are inserted into the hole-shaped defect structures 01.

For example, in the above-mentioned flexible transparent electrode provided by the embodiment of the present disclosure, as shown in FIG. 2, the part of the metal nanowires 2 located outside the hole-shaped defect structures 01 is arranged crosswise to form a mesh structure. For example, metal nanowires 2 that are not inserted into the hole-shaped defect structures 01 in the metal nanowires 2 and metal nanowires 2 inserted into the hole-shaped defect structures 01 in the metal nanowires 2 can be arranged crosswise to form a mesh structure. The mesh structure can reduce the resistance of the metal nanowires 2 and improve the stability of the metal nanowires 2.

For example, in order to reduce the manufacturing cost, in the above-mentioned flexible transparent electrode provided by the embodiment of the present disclosure, as shown in FIG. 2, the metal nanowires 2 are copper nanowires. However, the embodiments of the present disclosure are not limited in this aspect, and the metal nanowires 2 may also be silver nanowires to have higher conductivity.

Figure 3A:
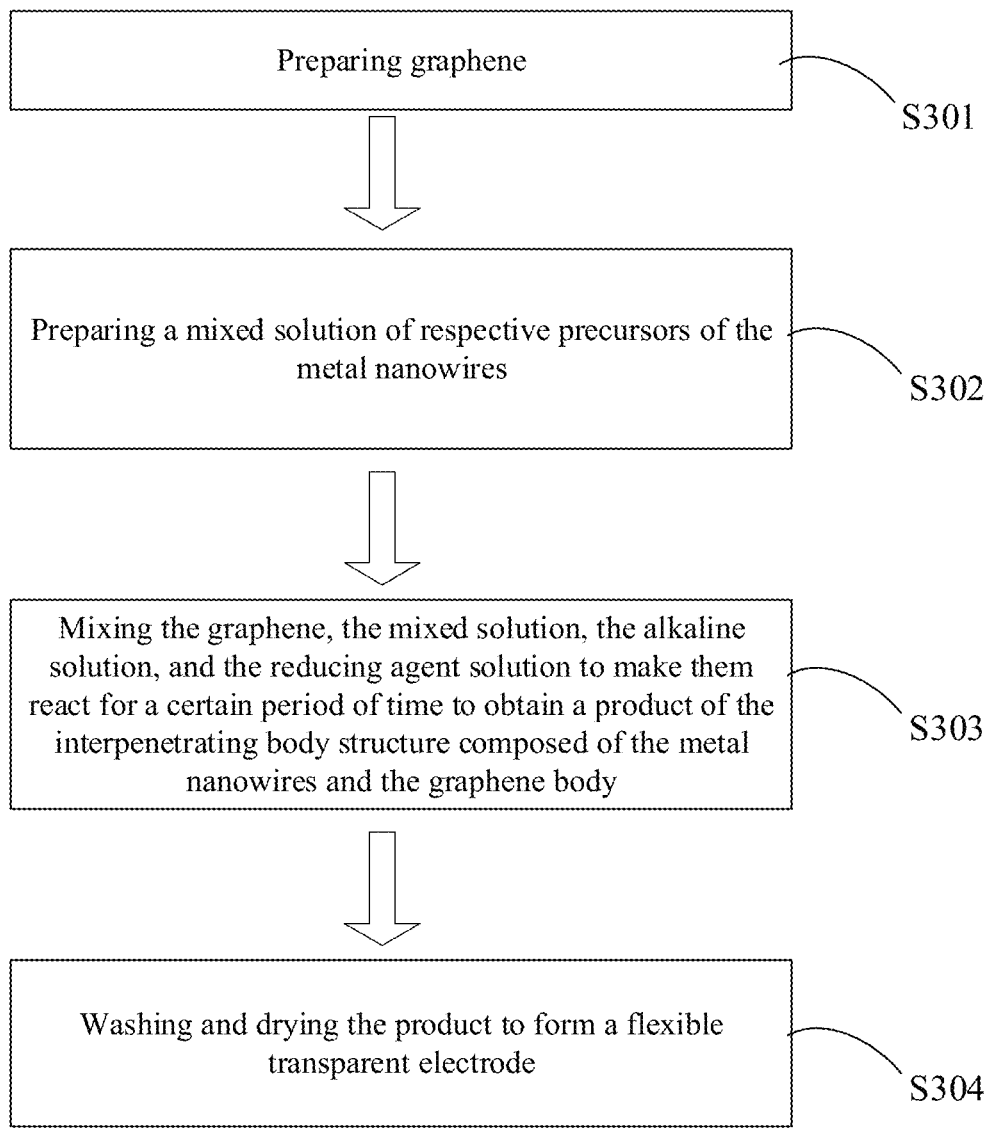
FIG. 3A is a schematic flowchart of a manufacture method of a flexible transparent electrode provided by an example of an embodiment of the present disclosure.

Based on the same inventive concept, the embodiments of the present disclosure also provide a manufacture method of a flexible transparent electrode, as shown in FIG. 3A, the manufacture method includes:

S301, preparing graphene.

For example, the graphene can be prepared by a Hummers method.

S302, preparing a mixed solution of respective precursors of the metal nanowires.

For example, the respective precursors include cupric nitrate trihydrate, deionized water, and ethylenediamine analytical reagent.

S303, mixing the graphene, the mixed solution, the alkaline solution, and the reducing agent solution to make them react for a certain period of time to obtain a product of the interpenetrating body structure composed of the metal nanowires and the graphene body.

For example, the alkaline solution may be sodium oxide solution, and the reducing agent solution may be hydrazine hydrate.

S304, washing and drying the product to form a flexible transparent electrode.

For example, the product can be washed with water and alcohol.

The manufacture method of the above-mentioned flexible transparent electrode provided by the embodiments of the present disclosure can manufacture a flexible transparent electrode with an interpenetrating body structure composed of metal nanowires and a graphene body. The flexible transparent electrode with the interpenetrating body structure, on one hand, can solve the problems of poor stability, large roughness, and poor bonding force with the flexible substrate of the metal nanowires, and on the other hand, can solve the problems that the graphene has high square resistance and low work function, which is not conducive to hole injection. The metal nanowires and the graphene body are formed into the interpenetrating body structure, which can compensate each other for their respective defects, thereby forming a flexible transparent electrode for replacing ITO materials. In addition, the flexible transparent electrode has high conductivity and transmittance, has a strong bonding force with a flexible substrate, and has high stability, and furthermore, the application of the flexible transparent electrode in a device can increase the life of the device.

Figure 4A:
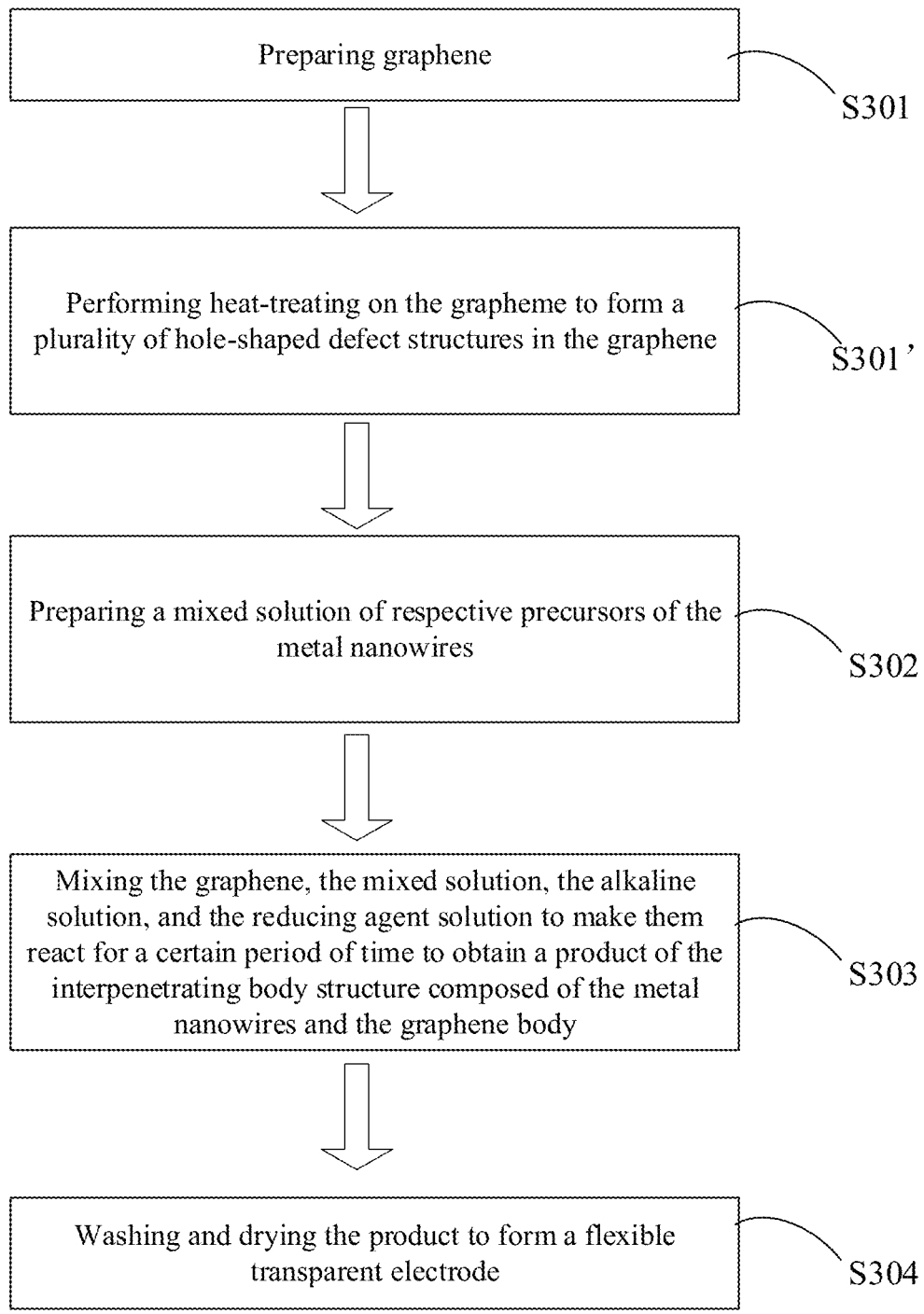
FIG. 4A is a schematic flowchart of a manufacture method of a flexible transparent electrode provided by another example of an embodiment of the present disclosure.

For example, in the manufacture method of the above-mentioned flexible transparent electrode provided by the embodiments of the present disclosure, as shown in FIG. 4A, after the graphene is prepared, and before the graphene, the mixed solution, the alkaline solution, and the reducing agent solution are mixed, the manufacturing method further includes:

S301', performing heat-treating on the graphene to form a plurality of hole-shaped defect structures in the graphene.

Because the surface of unmodified graphene has many oxygen-containing groups, and the presence of oxygen-containing groups has a certain effect on the conductivity of the graphene. In the present disclosure, by performing the heat-treating on the prepared graphene, such as performing the heat-treating on the prepared graphene in an argon atmosphere at a temperature of 600° C., so that oxygen-containing groups can be combined with carbon atoms of the graphene to form a gas to release. Therefore, the hole-shaped defect structures are formed at positions where the oxygen-containing groups are located. Due to the high activity and the low chemical barrier of the defect structures, in a case where the precursors of the metal nanowires and the graphene are mixed under a certain condition, the metal nanowires are extremely easy to grow at the defect structures. Because the surface of the graphene has many defect structures, the metal nanowires grow along the plurality of defect structures to form an interpenetrating body structure in which the metal nanowires are inserted into the hole-shaped defect structures.

Figure 3B:
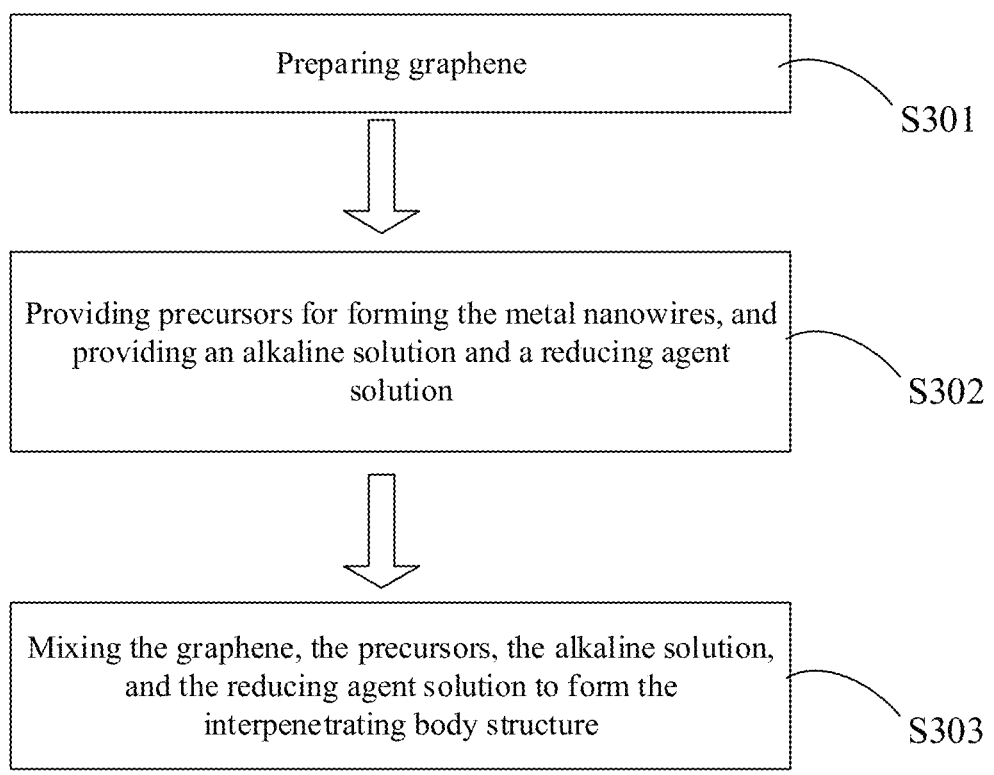
FIG. 3B is a schematic flowchart of a manufacture method of a flexible transparent electrode provided by another example of an embodiment of the present disclosure.

Another example of the embodiments of the present disclosure also provides a manufacture method of a flexible transparent electrode, as shown in FIG. 3B, the manufacture method includes:

S301, preparing graphene.

For example, the graphene oxide can be prepared by a Hummers method, and then the prepared graphene oxide is dried and a part of the prepared graphene oxide is dispersed in an aqueous solution to obtain a suspension. After the suspension is dispersed under ultrasonic conditions, the suspension is subjected to a reduction reaction by increasing temperature and adding the hydrazine hydrate and then is filtered, so as to obtain the graphene.

S302, providing precursors for forming the metal nanowires, and providing an alkaline solution and a reducing agent solution.

For example, the precursors refers to a raw material or precursor for synthesizing the metal nanowires. For example, the precursors may include cupric nitrate trihydrate and ethylenediamine analytical reagent. For example, the precursors may also include deionized water.

S303, mixing the graphene, the precursors, the alkaline solution, and the reducing agent solution to form the interpenetrating body structure.

For example, the alkaline solution may be sodium hydroxide solution, and the reducing agent solution may be hydrazine hydrate to form the metal nanowires by a reduction reaction.

For example, the graphene is uniformly dispersed in the deionized water, then the cupric nitrate trihydrate is added to the deionized water, in which the graphene is dispersed, and the deionized water is stirred, and then the ethylenediamine analytical reagent is added and stirred to form copper hydroxide, cuprous hydroxide, and other products. Then the alkaline solution is added to the above products, and the final formed product includes a mixture of cuprous and cupric, thereby facilitating subsequent formation of copper nanowires.

For example, after forming a combined product of the metal nanowires and the graphene, the product can be washed and dried to form a flexible transparent electrode; alternatively, after the combined product of the metal nanowires and the graphene is formed, the above-mentioned combined product can also be coated on a substrate, and the pressure is applied to the above-mentioned combined product to form a flexible transparent electrode.

For example, the product can be washed with water and alcohol.

The manufacture method of the above-mentioned flexible transparent electrode provided by the embodiments of the present disclosure can manufacture the flexible transparent electrode with the interpenetrating body structure composed of the metal nanowires and the graphene body. The flexible transparent electrode with the interpenetrating body structure, on one hand, can solve the problems of poor stability, easy oxidation, large roughness, and poor bonding force with the flexible substrate of the metal nanowires, and on the other hand, can solve the problems that the graphene has high square resistance and low work function, which is not conducive to hole injection. Therefore, the interpenetrating body structure formed by combining the metal nanowires and the graphene body can make the metal nanowires and the graphene body compensate each other for their respective defects, so as to form the flexible transparent electrode for replacing ITO materials; in addition, the interpenetrating body structure has high conductivity and transmittance, has a strong bonding force with a flexible substrate, and has high stability, and furthermore, the life of the device can be increased when the interpenetrating body structure are applied to the device.

Figure 4B:
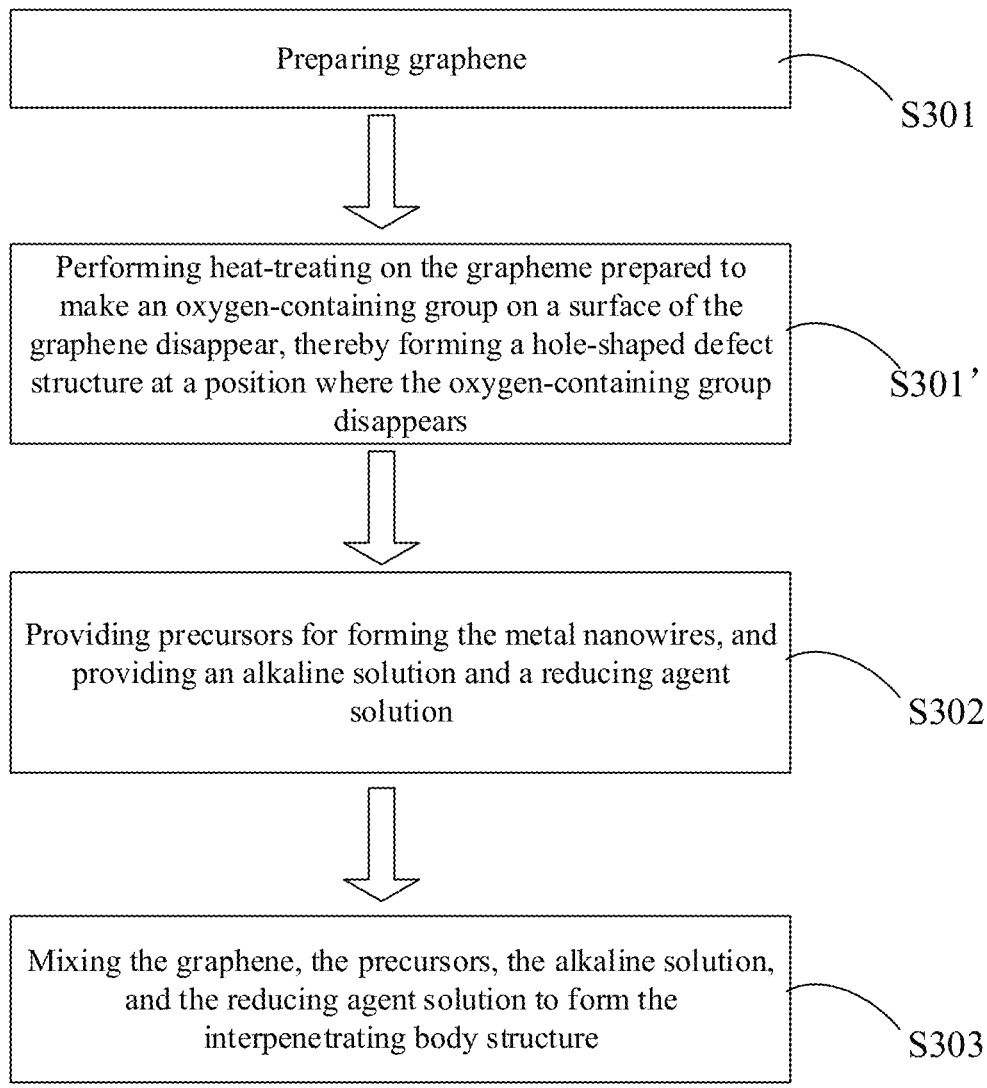
FIG. 4B is a schematic flowchart of a manufacture method of a flexible transparent electrode provided by another example of an embodiment of the present disclosure.

For example, in the manufacture method of the above-mentioned flexible transparent electrode provided by another example of the embodiment of the present disclosure, as shown in FIG. 4B, after the graphene is prepared and before the graphene is mixed with the precursors, the manufacture method further includes:

S301', performing heat-treating on the graphene prepared to make an oxygen-containing group on a surface of the graphene disappear, thereby forming a hole-shaped defect structure at a position where the oxygen-containing group disappears.

For example, the graphene can be produced by reduction of graphene oxide, however, under the influence of oxidation-reduction reaction, some oxygen-containing groups will remain in the graphene that is formed, and the presence of oxygen-containing groups has a certain effect on the conductivity of the graphene. In the embodiments of the present disclosure, the heat-treating is performed on the obtained graphene, such as performing the heat-treating on the obtained graphene in an argon atmosphere at a temperature ranging from 550° C. to 650° C. (for example, 600° C.), so that oxygen-containing groups can be combined with carbon atoms of the graphene to form a gas to release, and therefore, the above-mentioned hole-shaped defect structures are formed at the positions where the oxygen-containing group are located. For example, during the heat-treating process, the oxygen element in the graphene is reduced by 90%-95%, and as a result, most of the oxygen-containing groups will disappear to leave the hole-shaped defect structures.

Due to the high activity and the low chemical barrier of the defect structure, in a case where the precursors for forming the metal nanowires and the graphene are mixed under a certain condition, the metal nanowires are extremely easy to grow at the defect structures. Because the surface of the graphene has many defect structures, the metal nanowires grow along the plurality of defect structures to form an interpenetrating body structure in which the metal nanowires 2 are inserted into the hole-shaped defect structures 01.

The manufacture method of the flexible transparent electrode provided in FIG. 2 of the embodiment of the present disclosure will be described in detail below through specific embodiments:

Step 1: preparing graphene. For example, the graphene can be prepared by a Hummers method.

Step 2: performing heat-treating on the obtained graphene to form a plurality of hole-shaped defect structures in the graphene. For example, the heat-treating is performed on the graphene in an argon atmosphere at a temperature of 600° C., so as to form defect structures in the surface of the graphene.

Step 3: preparing a mixed solution of the respective precursors of the metal nanowires. For example, cupric nitrate trihydrate having a weigh of 2.42 g, deionized water having a volume of 100 mL, and ethylenediamine analytical reagent having a volume of 10 mL are mixed and stirred for 24 hours to obtain the mixed solution.

Step 4: mixing the graphene, the mixed solution, the alkaline solution, and the reducing agent solution to make them react for a certain period of time to obtain a product of the interpenetrating body structure composed of the metal nanowires and the graphene body. For example, the graphene having a weigh of 500 g, the above mixed solution, an appropriate amount of sodium hydroxide are dissolved in 1 L of water, and then are transferred to a flask to be heated to 80° C., and then are mixed and reacted with 0.5 mL of hydrazine hydrate for 1 hour, so as to obtain the product of the interpenetrating body structure composed of the metal nanowires and the graphene body.

Step 5: washing and drying the product to form the flexible transparent electrode. For example, the prepared product can be washed with water and alcohol, and can be dried for later use.

Through the above steps 1 to 5, the flexible transparent electrode provided in FIG. 2 of the embodiment of the present disclosure can be prepared.

For example, the manufacture method of the flexible transparent electrode provided in FIG. 2 of the embodiment of the present disclosure will be described in detail below through another example:

Step 1: preparing graphene.

Step 2: performing heat-treating on the obtained graphene to form a plurality of hole-shaped defect structures in the graphene.

For example, the heat-treating is performed on the graphene in an argon atmosphere at a temperature of 600° C., so that the hole-shaped defect structures are formed in the surface of the graphene.

Step 3: providing precursors for forming the metal nanowires, providing an alkaline solution and a reducing agent solution, and mixing the graphene, the precursors, the alkaline solution, and the reducing agent solution to form the interpenetrating body structure.

For example, the graphene having a weight of 100 mg is uniformly dispersed in a container filled with 100 mL of deionized water, and the cupric nitrate trihydrate having a weigh of 2.42 g is added to the container and stirred for 24 hours. And then ethylenediamine analytical reagent having a volume of 10 mL is added to the above container and is stirred evenly. Next, sodium hydroxide having a weigh of 500 g is dissolved in 1 L of water and is transferred to the above container, and the container is heated to 80° C. Finally, 0.5 mL of hydrazine hydrate analytical reagent is added to the above container, and is mixed and reacted for 1 hour to obtain the interpenetrating body structure composed of the metal nanowires and the graphene body.

Figure 5:
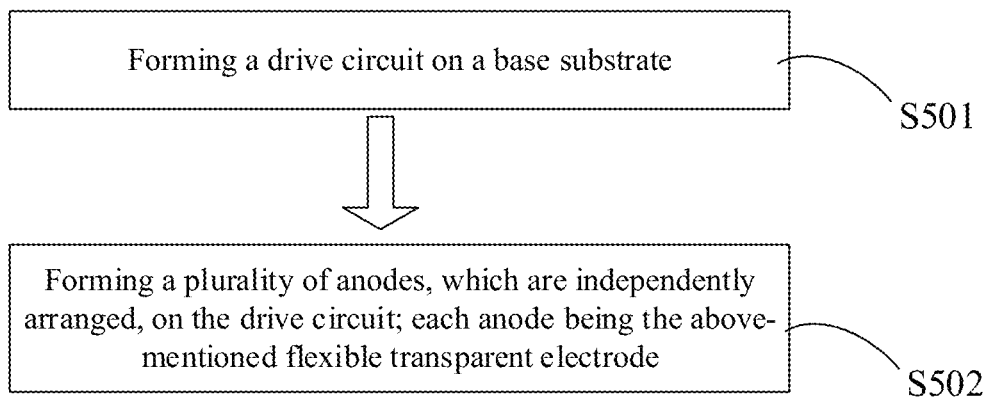
FIG. 5 is a schematic flowchart of a manufacture method of a flexible display panel provided by an embodiment of the present disclosure.

Based on the same inventive concept, the embodiments of the present disclosure also provide a manufacture method of a flexible display panel, as shown in FIG. 5, the manufacture method includes:

S501, forming a driving circuit on a base substrate;

S502, forming a plurality of anodes, which are independently arranged, on the driving circuit; each anode being the above-mentioned flexible transparent electrode.

For example, the product, which is manufactured in the manufacture method of the flexible transparent electrode provided by the embodiments of the present disclosure, with the interpenetrating body structure composed of the metal nanowires and the graphene body is dissolved, and the physical vapor deposition method is used to evaporate the above product to form a plurality of anodes which are independently arranged. For example, a metal mask can be used to evaporate the anode. The evaporation method of the anode is a technique well known to those skilled in the art, and will not be detailed here.

Figure 6:
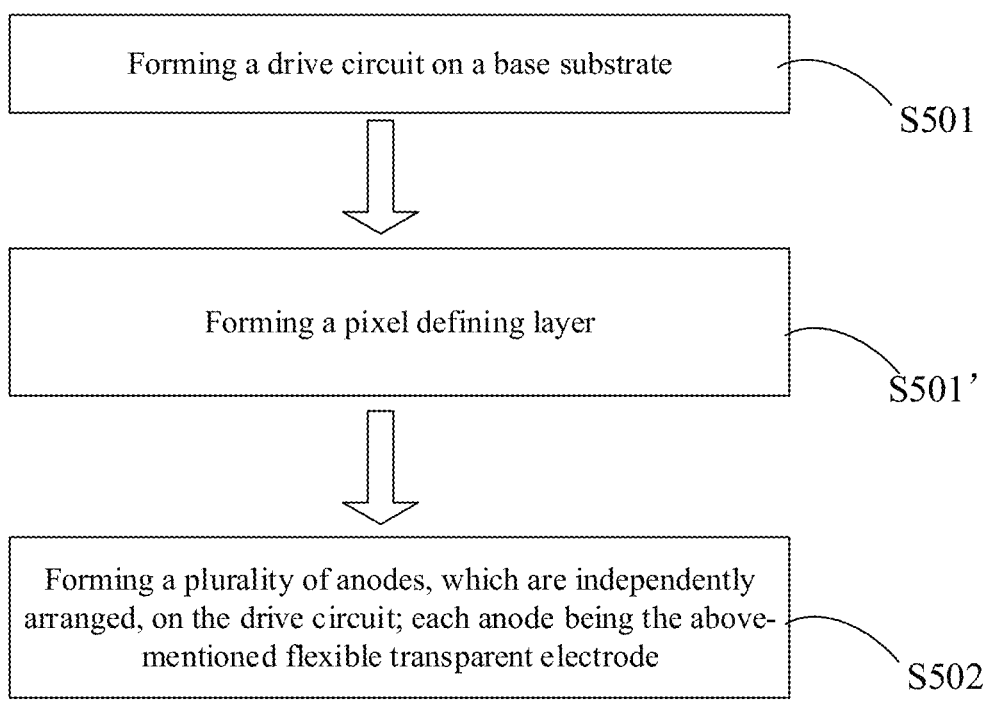
FIG. 6 is a schematic flowchart of a manufacture method of a flexible display panel provided by an embodiment of the present disclosure.

For example, in the above-mentioned manufacture method of the flexible display panel provided by the embodiment of the present disclosure, as shown in FIG. 6, before forming the anode, the manufacture method further includes:

S501', forming a pixel defining layer.

The pixel defining layer is used to define a pixel region. Because the pixel defining layer and respective film layers of the driving circuit are formed by a photolithography process, and the anode is formed by an evaporation process. The photolithography process and the evaporation process use different chambers, in order to reduce the manufacturing process, the pixel defining layer can be formed before the anode is formed, so that the pixel defining layer and the respective film layers of the driving circuit can be formed in the same chamber, thereby reducing the manufacturing process.

Based on the same inventive concept, the embodiments of the present disclosure also provide a flexible display panel, including a plurality of anodes, which are independently arranged, and the anodes are the above-mentioned flexible transparent electrodes provided by the embodiments of the present disclosure. Because the principle of solving the problem by the flexible display panel is similar to that of the aforementioned flexible transparent electrode, the implementation of the flexible display panel can refer to the implementation of the aforementioned flexible transparent electrode, and the similar portions will not be repeated.

Figure 7:
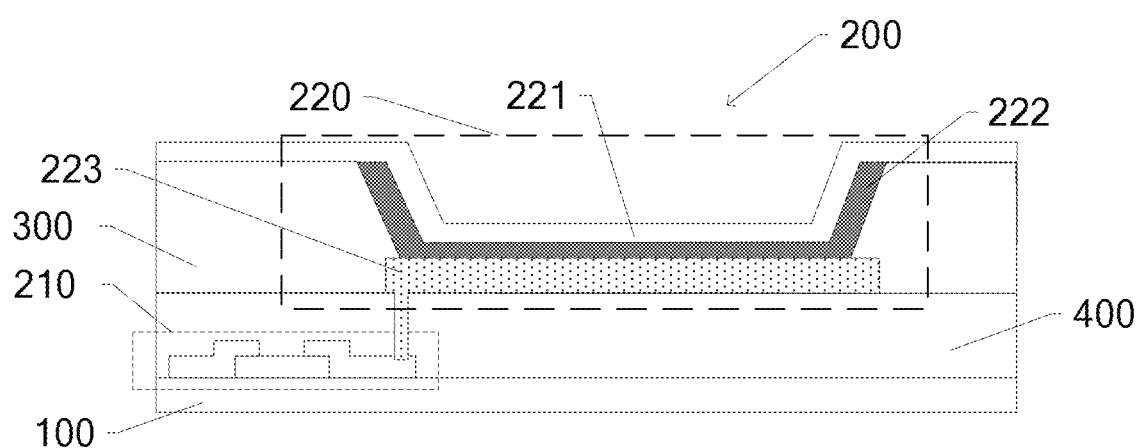
FIG. 7 is a schematic diagram of a partial cross-sectional structure of a flexible display panel provided by an embodiment of the present disclosure.

FIG. 7 is a schematic diagram of a partial cross-sectional structure of a flexible display panel provided by an embodiment of the present disclosure. As shown in FIG. 7, the flexible display panel includes: a base substrate 100; and a plurality of pixel units 200 on the base substrate 100. FIG. 7 schematically shows one pixel unit 200 among the plurality of pixel units 200. As shown in FIG. 7, each pixel unit 200 includes a driving circuit 210 located on the base substrate 100 and a light-emitting element 220 located on a side of the driving circuit 210 away from the base substrate 100. Each light-emitting element 220 includes a first electrode 221, a light-emitting layer 222, and a second electrode 223 that are stacked. The second electrode 223 is located on a side of the light-emitting layer 222 facing the driving circuit 210 and is electrically connected to the driving circuit 210. The second electrode 223 is the flexible transparent electrode described in the above embodiments.

For example, the driving circuit 210 may include a drive transistor, and the drive transistor may include a control terminal, a first terminal, and a second terminal, and is configured to be electrically connected to the second electrode 223 (i.e., the flexible transparent electrode) of the light-emitting element 200, to provide the light-emitting element 220 with drive current for driving the light-emitting element 220 to emit light.

For example, as shown in FIG. 7, the side of the driving circuit 210 facing the light-emitting element 220 is provided with a transparent insulating layer 400 to insulate the second electrode 223 from the driving circuit 210.

For example, as shown in FIG. 7, the flexible display panel further includes a pixel defining layer 300, and the pixel defining layer 300 includes a plurality of openings for defining light-emitting regions of sub-pixels. The plurality of openings expose the second electrodes 223, in a case where the subsequent light-emitting layers 222 are formed in the openings of the pixel defining layer 300, the light-emitting layers 222 are in contact with the second electrodes 223, so that the parts, which are in contact with the light-emitting layers 222, of the second electrodes 223 can drive the light-emitting layers 222 to emit light.

The flexible display panel provided by the embodiments of the present disclosure adopts the interpenetrating body structure including the metal nanowires and the graphene body, which is beneficial to improve the display effect and service life.

Based on the same inventive concept, the embodiments of the present disclosure also provide a display device, including the above-mentioned flexible display panel provided by the embodiments of the present disclosure. Because the principle of solving the problem by the display device is similar to that of the aforementioned flexible transparent electrode, the implementation of the display device can refer to the implementation of the aforementioned flexible transparent electrode, and the similar portions will not be repeated.

The above-mentioned display device provided by the embodiment of the present disclosure may be any product or component with a display function, such as a tablet computer, a television, a display, a notebook computer, a digital photo frame, and a navigator. The other indispensable components of the display device are understood by those of ordinary skill in the art, will not be repeated here, and should not be used as a limitation to the present disclosure.

Obviously, various changes and modifications can be made by those skilled in the art to the present disclosure, without departing from the spirits and the scope of the present disclosure. In this way, so far as these modifications and variations of the present disclosure fall within the scope of the claims and their equivalent technologies of the present disclosure, the present disclosure shall also intend to include these modifications and variations.

The following statements should be noted:

(1) In the accompanying drawings of the embodiments of the present disclosure, the drawings involve only the structure(s) in connection with the embodiment(s) of the present disclosure, and other structure(s) can be referred to common design(s).

(2) In the case of no conflict, features in one embodiment or in different embodiments can be combined.

What have been described above are only specific implementations of the present disclosure, the protection scope of the present disclosure is not limited thereto, and the protection scope of the present disclosure should be based on the protection scope of the claims.

What is claimed is:

1. A flexible transparent electrode, comprising:
a graphene body and metal nanowires,
wherein at least part of the metal nanowires is inserted into the graphene body to form an interpenetrating body structure; and
the graphene body has at least one hole-shaped defect structure, and the at least part of the metal nanowires is inserted into the hole-shaped defect structure.

2. The flexible transparent electrode according to claim 1, wherein a part of the metal nanowires located outside the hole-shaped defect structure is arranged crosswise to form a mesh structure.

3. The flexible transparent electrode according to claim 1, wherein the metal nanowires comprise a copper nanowire or a silver nanowire.

4. The flexible transparent electrode according to claim 1, wherein a hole diameter of the at least one hole-shaped defect structure ranges from 1 micron to 10 microns.

5. A manufacture method of the flexible transparent electrode according to claim 1, comprising:
preparing graphene;
providing precursors for forming the metal nanowires, providing an alkaline solution and a reducing agent solution; and
mixing the graphene, the precursors, the alkaline solution, and the reducing agent solution to form the interpenetrating body structure.

6. The manufacture method according to claim 5, wherein providing the precursors for forming the metal nanowires comprises: preparing a mixed solution of respective precursors of the metal nanowires;
mixing the graphene, the precursors, the alkaline solution, and the reducing agent solution comprises: mixing the graphene, the mixed solution, the alkaline solution, and the reducing agent solution to make them react for a certain period of time to obtain a product of the interpenetrating body structure composed of the metal nanowires and the graphene body;
after forming the interpenetrating body structure, the manufacture method further comprises:
washing and drying the product to form the flexible transparent electrode.

7. The manufacture method according to claim 5, wherein mixing the graphene, the precursors, the alkaline solution, and the reducing agent solution comprises:
adding the precursors to the graphene to react for a certain period of time, and then adding the alkaline solution and the reducing agent solution in sequence.

8. The manufacture method according to claim 5, wherein after preparing the graphene and before mixing the graphene with the precursors, the manufacture method further comprises:
performing heat-treating on the graphene prepared to make an oxygen-containing group on a surface of the graphene disappear, thereby forming a hole-shaped defect structure at a position where the oxygen-containing group disappears.

9. The manufacture method according to claim 8, wherein oxygen element in the graphene is reduced by 90%-95% during a process of performing the heat-treating.

10. The manufacture method according to claim 8, wherein performing the heat-treating on the graphene prepared comprises: performing the heat-treating on the graphene in an argon atmosphere at a temperature ranging from 550° C. to 650° C.

11. A flexible display panel, comprising a plurality of anodes, wherein each anode is the flexible transparent electrode according to claim 1.

12. A flexible display panel, comprising:
a base substrate; and
a plurality of pixel units located on the base substrate, wherein each pixel unit comprises a driving circuit located on the base substrate and a light-emitting element located on a side of the driving circuit away from the base substrate, each light-emitting element comprises a first electrode, a light-emitting layer, and a second electrode that are stacked, and the second electrode is located on a side of the light-emitting layer facing the driving circuit and is electrically connected to the driving circuit, wherein the second electrode is the flexible transparent electrode according to claim 1.

13. A display device, comprising the flexible display panel according to claim 11.

14. A manufacture method of the flexible display panel according to claim 11, comprising:

forming a driving circuit on a base substrate;

forming a plurality of anodes, which are independently arranged, on the driving circuit; wherein each anode is the flexible transparent electrode.

15. The manufacture method of the flexible display panel according to claim 14, wherein before forming the plurality of anodes, the manufacture method further comprises: forming a pixel defining layer on a side of the driving circuit away from the base substrate.

16. The manufacture method according to claim 9, wherein performing the heat-treating on the graphene prepared comprises: performing the heat-treating on the graphene in an argon atmosphere at a temperature ranging from 550° C. to 650° C.

* * * * *